(12) United States Patent
Tromp (10) Patent No.: US 7,432,514 B2
(45) Date of Patent: Oct. 7, 2008

(54) METHOD AND APPARATUS FOR SURFACE POTENTIAL REFLECTION ELECTRON MASK LITHOGRAPHY

(75) Inventor: Rudolf M. Tromp, North Salem, NY (US)

(73) Assignee: International Business Machines Corporation, Armonk, NY (US)

( * ) Notice: Subject to any disclaimer, the term of this patent is extended or adjusted under 35 U.S.C. 154(b) by 1263 days.

(21) Appl. No.: 10/105,258

(22) Filed: Mar. 26, 2002

(65) Prior Publication Data

US 2003/0183781 A1    Oct. 2, 2003

(51) Int. Cl.
    *G21K 5/10* (2006.01)
(52) U.S. Cl. .................................. 250/492.22
(58) Field of Classification Search ............... 250/492.2, 250/492.22, 492.23, 492.3; 430/5, 296, 311
    See application file for complete search history.

(56) References Cited

U.S. PATENT DOCUMENTS

| | | | |
|---|---|---|---|
| 5,254,417 A * | 10/1993 | Wada | 430/5 |
| 5,319,207 A | 6/1994 | Rose et al. | |
| 5,393,623 A * | 2/1995 | Kamon | 430/5 |
| 6,277,542 B1 * | 8/2001 | Okino et al. | 430/296 |
| 6,610,980 B2 * | 8/2003 | Veneklasen et al. | 250/310 |
| 6,803,571 B1 * | 10/2004 | Mankos et al. | 250/310 |
| 6,870,172 B1 | 3/2005 | Mankos et al. | |
| 2001/0038953 A1 * | 11/2001 | Tsukamoto et al. | 430/5 |

* cited by examiner

*Primary Examiner*—Frank G Font
*Assistant Examiner*—James P. Hughes
(74) *Attorney, Agent, or Firm*—Ido Tuchman, Esq.; McGinn IP Law Group, PLLC (57) ABSTRACT

A method (and structure) for controlling a beam used to generate a pattern on a target surface includes generating a beam of charged particles and directing the beam to a mask surface and causing the beam to be either absorbed by or reflected from the mask surface, thereby either precluding or allowing the beam to strike the target surface, based on a reflection characteristic of the mask surface.

8 Claims, 7 Drawing Sheets

(PRIOR ART)

METHOD AND APPARATUS FOR SURFACE POTENTIAL REFLECTION ELECTRON MASK LITHOGRAPHY

BACKGROUND OF THE INVENTION

1. Field of the Invention

The present invention generally relates to forming patterns on electronic wafers, and more specifically to a new mask technology called SUPREMA (Surface Potential Reflection Electron MAsk) which allows manipulation of reflection characteristics of areas on a mask wafer surface that may be thought of as pixels in a matrix. As a beam illuminates the mask wafer, individual pixels are effectively turned on and off so that the beam will subsequently write the pattern of interest with deep submicron resolution onto a target wafer. In a preferred embodiment providing a programmable mask, writing a new pattern on the mask surface does not require a change of the mask surface itself, but instead changes in software which then controls a voltage of individual pixel-areas on the mask surface.

2. Description of the Related Art

Modern microelectronic manufacturing requires high resolution lithography. As 0.1 µm feature sizes are approached, optical lithography methods are rapidly becoming obsolete. Several large efforts are under way to develop so-called Next Generation Lithography (NGL) methods. These include Extreme Ultra-Violet (EUV), ion beam projection, and electron beam projection lithographies.

Figure 1:
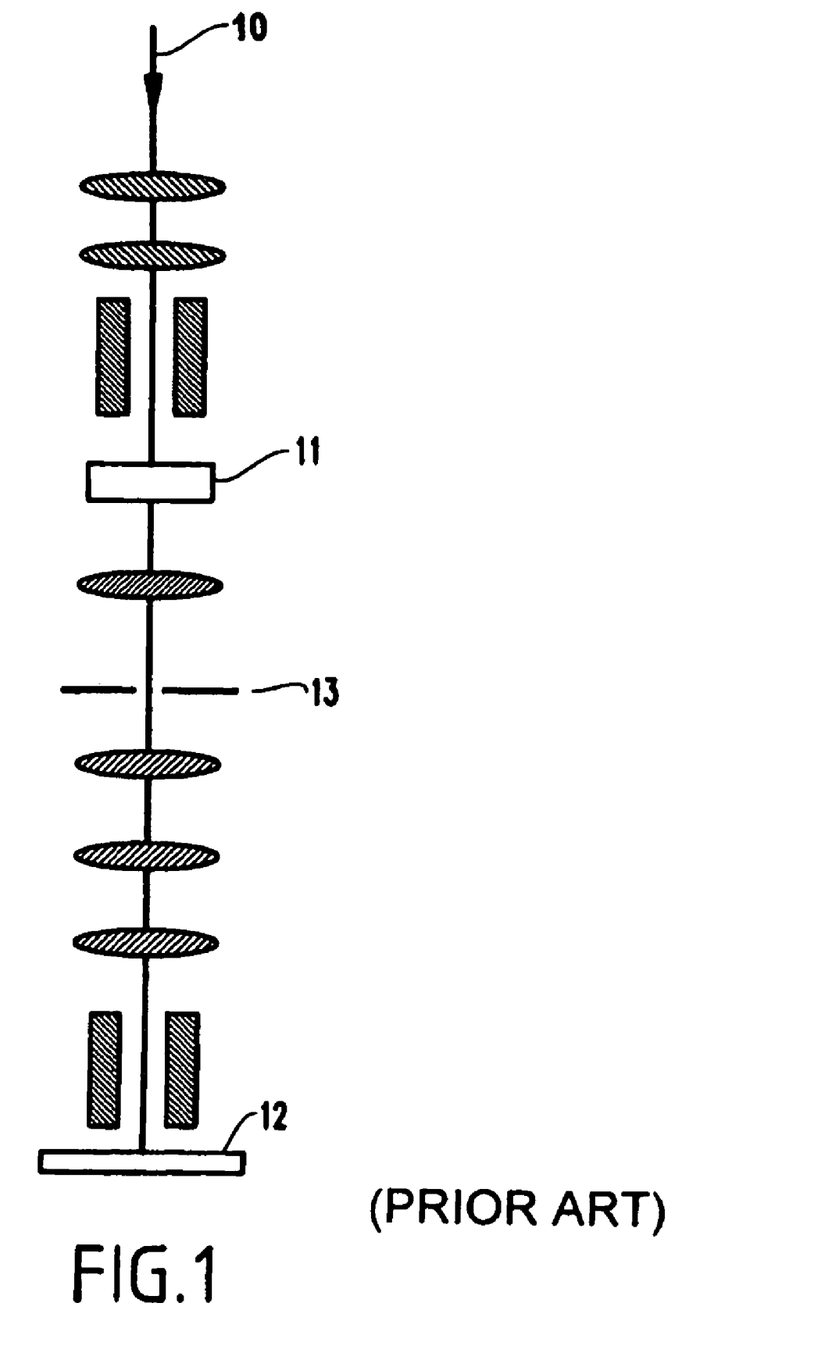
FIG. 1 illustrates the principle of a conventional mask technology.

The principal efforts in electron beam lithography are "Scalpel"® and "Prevail"®, in which a high energy electron beam passes through a mask. As shown in FIG. 1, in "Scalpel"®, a thin film mask 11 with a metallic scattering layer is used to disperse the electron beam 10 in areas that are not to be exposed on the wafer 12. Wafer 12 has a photoresist layer on its upper surface (not shown in the figure). A contrast aperture 13 in the objective lens backfocal plane removes these scattered electrons from the beam. The thin film mask is supported by an array of struts that periodically interrupt the pattern to be printed.

"Prevail"® uses a stencil mask. Since a stencil mask cannot support free-floating elements, two consecutive masks are required to expose the wafer to a given pattern.

In both schemes, mask and wafer must be scanned together in lockstep, at a fixed demagnification, with the mask stage periodically jumping ahead over the struts. The electron beam sweeps across the mask, exposing the wafer in a manner much like an electron beam sweeping across a CRT monitor. For both "Scalpel" and "Prevail", the mask technology is complex and expensive, and the resulting masks are extremely fragile.

Like all current lithography methods other than direct e-beam write, a new pattern requires a new mask to be manufactured and introduced into the e-beam projection column. With mask costs easily exceeding $50K, this constitutes a significant cost in the microelectronic manufacturing process. What is needed in the art is a technology that allows mask costs to be reduced while maintaining or even improving resolution and throughput. Prior to the present invention, no such technology has been known.

SUMMARY OF THE INVENTION

In view of the foregoing problems, drawbacks, and disadvantages of the conventional systems, it is an object of the present invention to provide a structure (and method) for electronic wafer preparation in which a mask for generating an image of the wafer is a programmable mask.

It is another object of the present invention to provide for an electronic wafer mask having reduced cost compared to current technologies.

It is another object of the present invention to teach a variety of forms for the electronic mask in this new technology.

To accomplish these goals and objectives, as a first aspect of the present invention, described herein is a method and apparatus of controlling a beam used to generate a pattern on a target surface, including generating a beam of charged particles and directing the beam to a mask surface and causing the beam to be one of absorbed by and reflected from the mask surface, thereby either precluding or allowing the beam to continue on to strike the target surface based on a reflection characteristic of the mask surface.

As a second aspect of the present invention, described herein is a mask used to control a beam for generating a pattern on a target wafer surface, the beam including charged particles directed onto a surface of the mask, the mask including an essentially planar surface in which the surface contains a plurality of areas, each area having a surface characteristic such that the beam is one of essentially absorbed by the surface and essentially reflected from the surface.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Referring now to the drawings, a new electron beam lithography method based on a new mask technology called SUPREMA is now described in detail. SUPREMA technology allows the writing of patterns on a wafer by a projection method utilizing a large number of individually addressable parallel electron beams generated by a universal mask. These beams may be thought of as pixels in a matrix. This beam pixel matrix is scanned across the wafer, turning individual pixels on and off to write the pattern of interest with deep submicron resolution.

Writing a new pattern does not require a change of mask, but rather a change of software addressing the mask. Unlike the conventional projection electron beam lithography methods (e.g., "Scalpel", "Prevail") the mask is stationary, and is not traversed by a high energy electron beam. Instead, the mask is fabricated on a standard Si wafer, using standard fabrication methods. Thus, mask motion, exposure and fabrication methods common to "Scalpel" and "prevail" are eliminated by this invention. Wafer throughput numbers are estimated to be somewhat better than "Scalpel"/"Prevail".

Optimally, an electronic wafer mask would be universal in the same sense that a computer display is universal. To present a new image on a computer screen the display screen is not exchanged. Rather, the pattern used to address the pixels on the display screen is generated for each image.

Similarly, mask fabrication costs could be reduced significantly if it relied on standard semiconductor manufacturing schemes that can be applied in bulk, if the mask is easily programmable for new patterns, and if the mask would be assembled on a bulk wafer, rather than a thin membrane. This invention describes such a mask technology.

Figure 2:
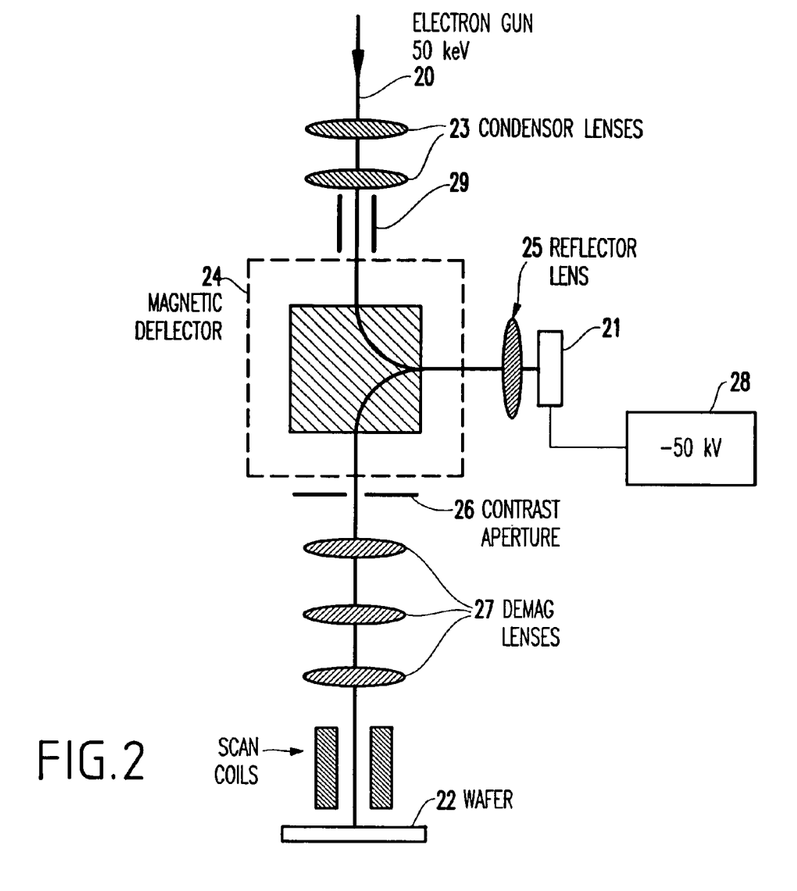
FIG. 2 is a schematic of an exemplary layout of the present invention.

FIG. 2 shows an exemplary layout of the present invention. Basically, an electron beam 20 is deflected to mask wafer 21. The surface of this mask wafer 21 has a pattern to be transferred to the resist layer on target wafer 22. The pattern is represented on the surface of mask wafer 21 by differences in reflectivity of individual points or regions on the mask wafer surface. Based on this surface reflectivity, the beam 20 will be allowed either to continue on to the target wafer 22 because it was reflected by a mask wafer surface point or would be precluded from striking the target wafer because a point on the mask wafer absorbed the beam rather than reflecting it.

Additional details of a preferred implementation of a SUPREMA projection system can be seen with reference to FIG. 2. An electron source creates an electron beam. Using suitable condenser optics 23, this beam is steered into a magnetic prism array 24 that deflects the beam over an angle θ, here conveniently chosen at 90 degrees although other deflection angles are possible. The prism array 24 acts like a series of round lenses with well-defined optical properties. The prism array can be designed to be achromatic over its full range of working distances. Such prism arrays have recently been employed successfully in several Low Energy Electron Microscopy (LEEM) designs. The electron beam is focused in the backfocal plane of the reflector lens 25. The mask wafer 21 is held at a potential 28 close to that of the gun electron emitter, so that the incident electron beam is decelerated to near zero energy. The mask is in fact an integral part of the reflector lens 25 imaging system, as it is in LEEM. Electrostatic potentials applied to the individual pixel elements on the mask turn individual beam elements on and off as desired. The reflected beam pixel array is accelerated back into the reflector lens 25, forming a crossover in the backfocal plane. A contrast aperture 26 placed in this backfocal plane, or in a conjugated plane further down the beam path (as is shown in FIG. 2), selects only specularly scattered electrons to optimize on/off contrast. The prism array 24 now deflects the beam pixel array downward, again over an angle θ. Suitable projection optics 27 can now demagnify the beam pixel array for target wafer 22 exposure.

For instance, if the pixel elements on the mask have a lateral extent of 250 nm, a 10× demagnification would give rise to 25 nm beam pixels on the wafer. With a reasonable beam size of 50×50 μm impinging on the mask, divided in 200×200 250×250 nm pixels, the wafer is exposed to a 40,000 PBA, with an individual pixel beam size of 25×25 nm. Since the exposure dose in $\mu C/cm2$ is fixed for a given combination of electron beam resist and electron energy, the time required to expose a square centimeter of wafer area depends on the available beam current only, not on the beam demagnification. Thus, a demagnification can be chosen that is optimal for the feature sizes to be written.

To write a pattern on the wafer it is desirable to rapidly scan the beam pixel array back and forth along one direction (using scan coils 29 in the projector column), while the wafer stage moves incrementally along the orthogonal direction, effectively moving the pixel array in a raster-like fashion across the wafer surface. Such raster scanning is preferable over a stationary beam with all motions carried out by the wafer stage, because it strongly reduces stage velocity and acceleration. The programmable SUPREMA mask does not move, nor does the electron beam at that point in the column.

From a simple analysis of realistically available electron beam sources, electron beam resist sensitivities, required wafer throughputs (equal or better than "Scalpel"), and resulting beam scanning speeds, beam pixel 'live' times of 0.1-1μ seconds can be arrived at, i.e., switching frequencies of 1-10 MHz. Such switching frequencies are well within the range of available transistor technologies.

Figure 3:
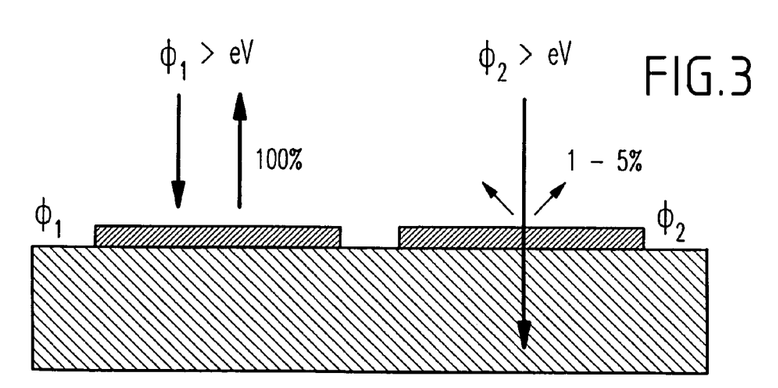
FIG. 3 illustrates the principle of surface potential electron reflection.

Turning now to FIG. 3, the principle behind SUPREMA is explained as based on an observation commonly made in Low Energy Electron Microscopy (LEEM). In LEEM, the sample under study forms a cathode in an electrostatic immersion objective lens. That is, there is a strong electrostatic field between the objective lens and the sample. An electron beam (typical energy 5-20 keV) is focused in the backfocal plane of the objective lens, and decelerated by the immersion field to near zero energy on its way to the sample. The exact electron energy at the sample is determined by the voltage difference between the electron gun emitter (field emitter or filament) and the sample.

After sample interaction, electrons are accelerated back into the objective lens, forming a cross-over in the backfocal plane of the objective lens, and a Gaussian image of the sample at some greater distance. The electron reflectivity from the sample depends strongly on the electron energy at the sample surface. When the electrons strike the sample prior to reflection (i.e., a sample potential smaller than gun potential), reflectivity is on the order of 1-5 percent, and reflected electrons are scattered over a wide range of angles, as shown in the right side of FIG. 3. When the electrons reflect in front of the sample (often referred to as 'mirror' mode, with the sample potential greater than the gun potential), reflectivity is 100 percent and specular, as shown in the left side of FIG. 3. When a contrast aperture is placed in the backfocal plane, accepting only electrons in the specular direction, the contrast difference between mirror and non-mirror electrons is accentuated even further, with resulting contrast ratios of about 100:1. The sample voltage swing between mirror and non-mirror is small, around one to two volts.

Figure 4:
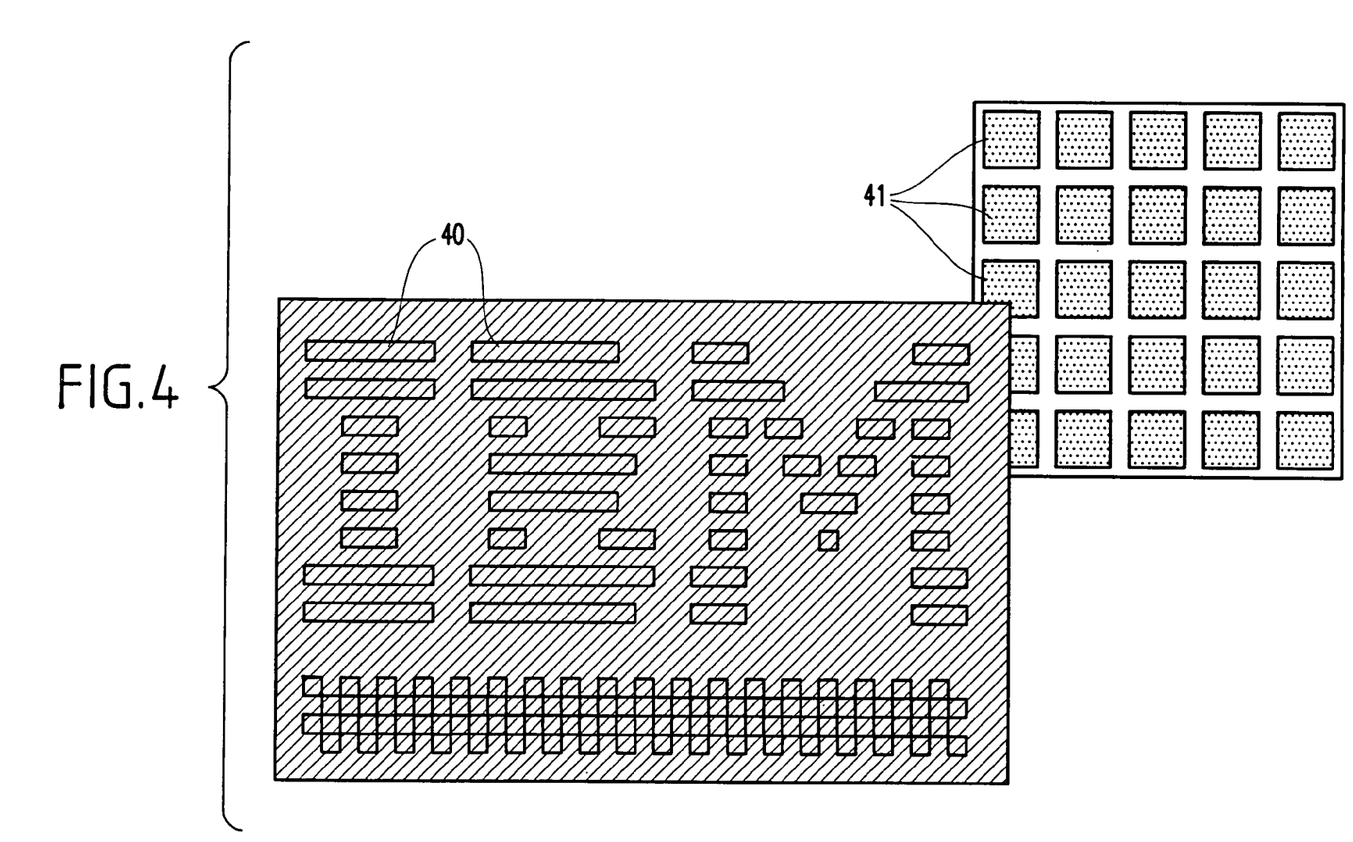
FIG. 4 illustrates masks as being either regions of various reflectivities or as pixels having individual reflectivity.

The mask wafer 21 shown in FIG. 2 takes advantage of this reflection phenomenon. As shown in FIG. 4, this mask wafer 21 could have various entire regions 40 whose reflectivities comprise a pattern. Alternatively, the mask wafer 21 could be considered as a matrix of pixels 41, each pixel being a point or area whose reflectivity is individually controlled. There are several ways to affect the electrostatic potential on the surface, as embodied by the target mask 21 of the present invention.

Figure 5:
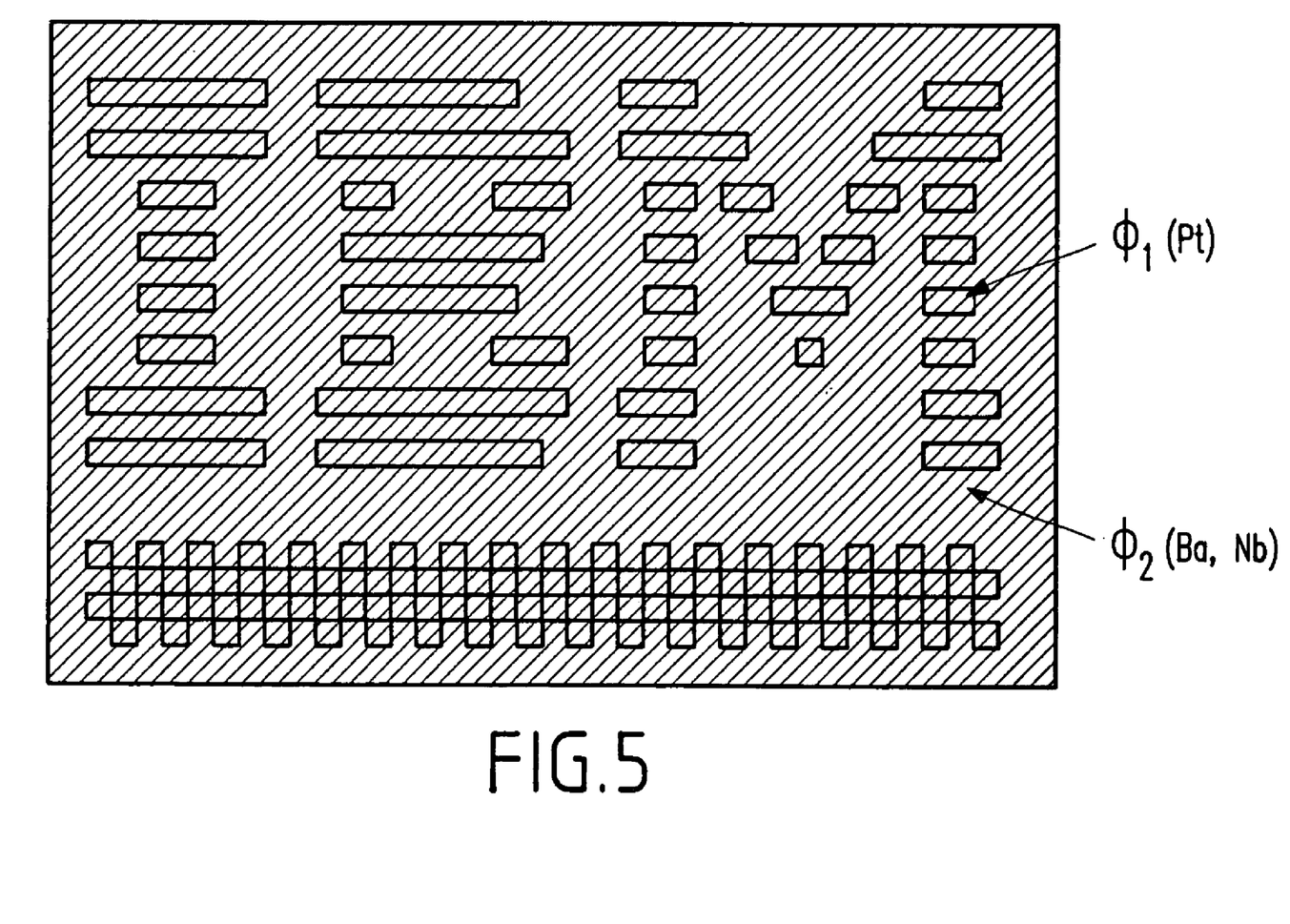
FIG. 5 illustrates a mask having regions of materials with various work functions in desired patterns.

The first method relies on variations of electron workfunction for different elements. Elements such as Barium (Ba) and Niobium (Nb) have very low electron workfunctions of about 2.5 V. Platinum (Pt) on the other hand has a high workfunction of about 5.5 V. If a pattern of Pt areas (i.e., dots) is printed on top of a Nb thin film, the Pt dots will have an electrostatic potential that is higher than the Nb film by about 3 eV. Thus, as shown in FIG. 3, an electron beam with a potential between the Pt and Nb workfuntions will be reflected specularly with 100% efficiency by the Pt dots, but scattered diffusely with 1-5% efficiency by the Nb film. The reflected electron beam includes an array of bright spots corresponding to the Pt dots, against a much darker uniform background, as shown in FIG. 5. Such a static workfunction-based SUPREMA mask has both advantages and disadvantages. For example, such a mask is easy to make on a bulk substrate and relies on conventional lithographic methods.

However, since the mask is too large to be printed all at once, the electron beam must image the entire mask onto the wafer in a scanning fashion, as is the case in "Scalpel" and "Prevail" discussed above. To do this effectively, both the mask and the wafer need to move under the electron beam. In addition, the workfunction may not be an entirely robust property. For instance, if the mask were to get covered with a 1 nm contaminating carbon film, the workfunction contrast would be largely lost.

Fortunately, a simple alternative scheme can be devised to switch a reflected electron beam ON and OFF by controlling the voltage of the surface of the mask wafer. In this scheme, the voltage is dropped below mirror mode voltage to turn the beam OFF and raised above mirror mode to turn it ON. If the sample surface is not a single plane held at a single potential, but a pixelated plane containing n×m metallic electrodes and the potential of each electrode is controlled individually, then the mask becomes a pixelated plane with points individually controlled for reflectivity.

Such could be performed in several ways. One way would be to attach a control conductor to each pixel and separately control the voltage of each electrode. As shown by exemplary array 60, 61, 62 in FIG. 6, various configurations of arrays could be used, with each configuration having advantages and disadvantages.

Figure 6:
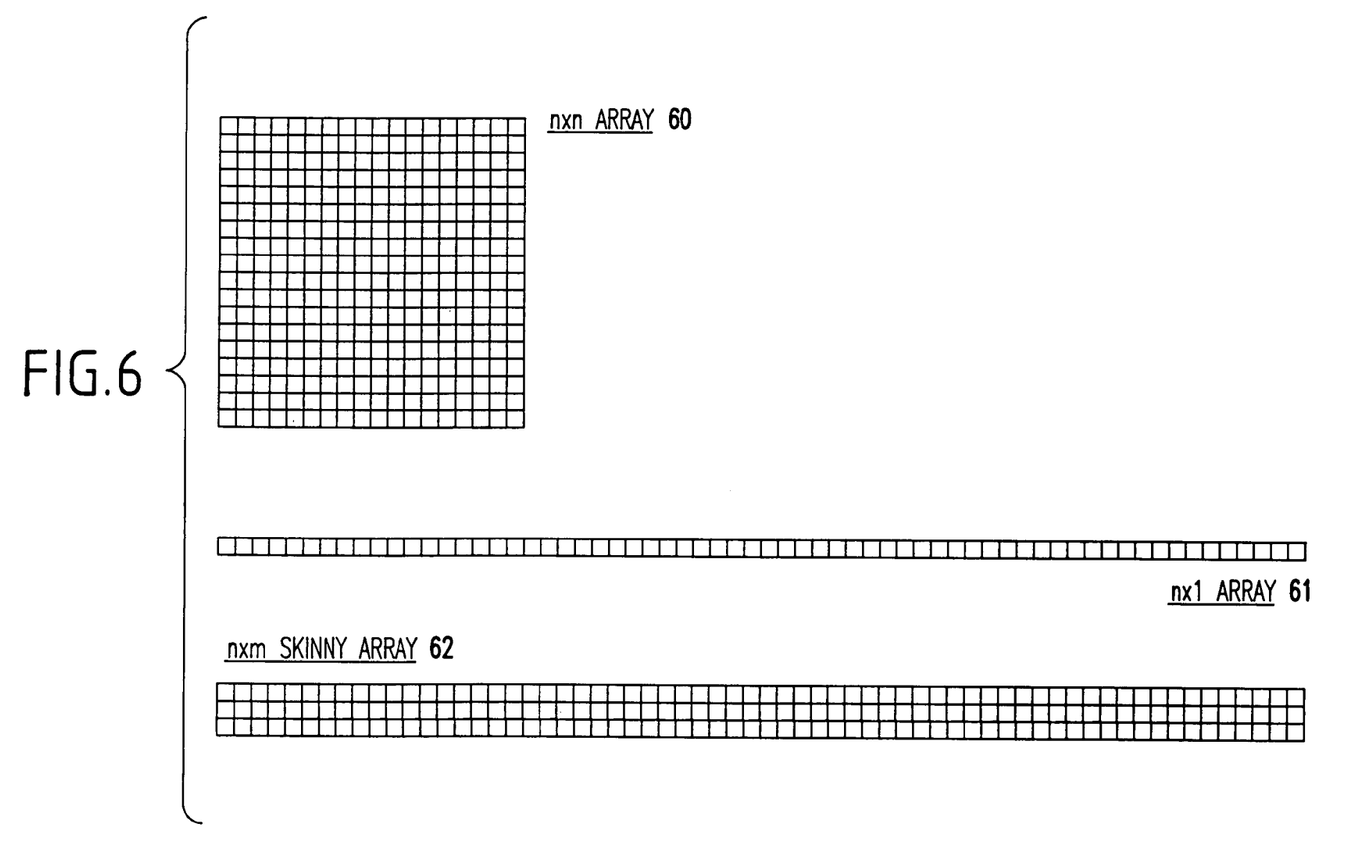
FIG. 6 illustrates exemplary pixel array configurations for an electrode mask.

As examples, the n×n array 60 has a disadvantage that it would be hard to wire all pixels in the array. The advantage is that the throughput does not depend on layout, only total beam current. The n×1 vector array 61 has the advantage that it would be much easier to wire the pixels but has the disadvantages of having an extreme aspect ratio and large field size. The n×m skinny array 62 has a middle ground in that it has a modest aspect ratio and is not too hard to wire all the pixels.

Figure 7:
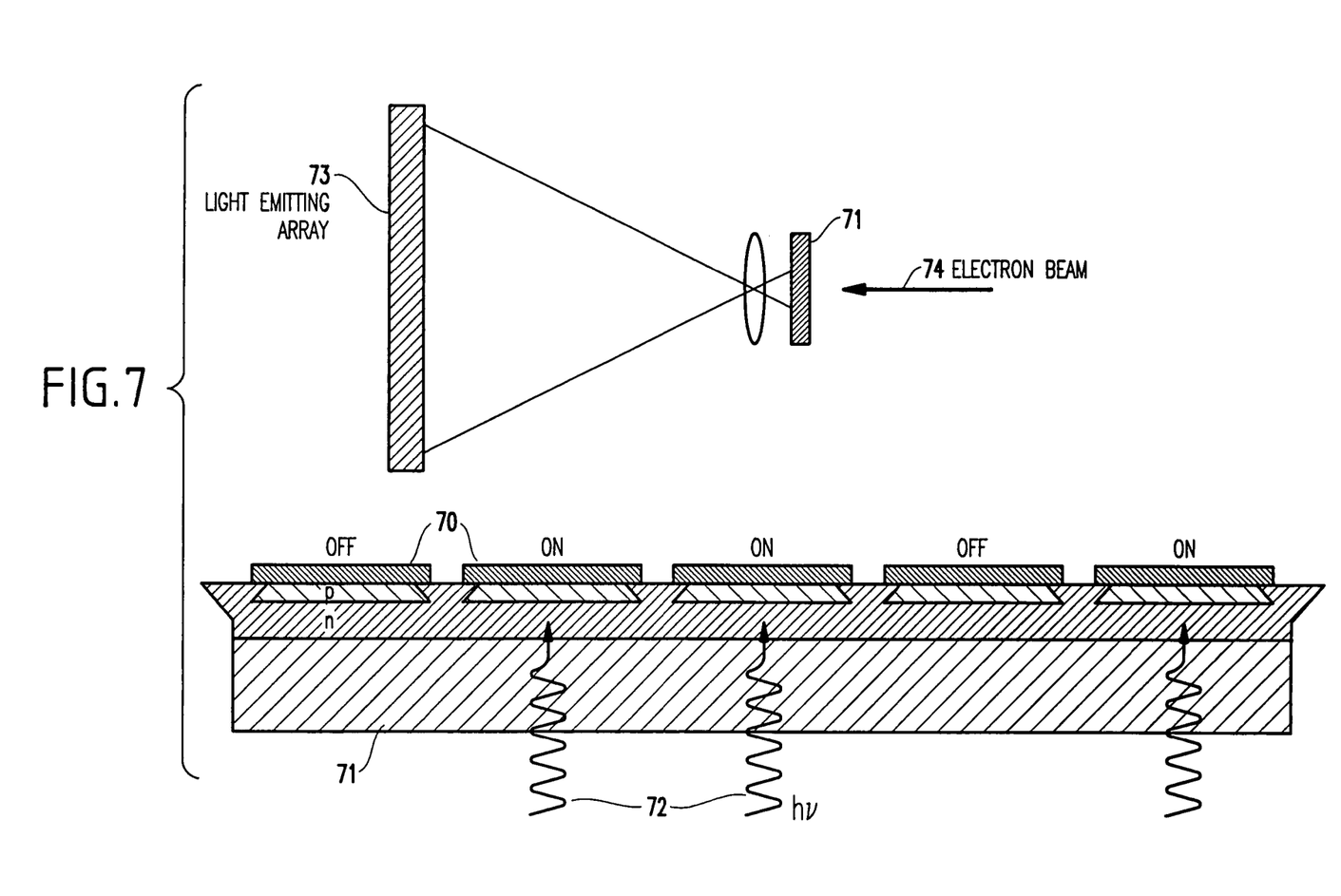
FIG. 7 illustrates an exemplary preferred embodiment using photodiodes to form a pixel array.

Alternatively, as shown in FIG. 7, a matrix of photodiodes 70, each photodiode corresponding to a pixel, could be fabricated into the mask wafer 71. Each pixel is individually controlled by shining light 72 on the corresponding photodiode from a source such as a light emitting array 73. An illuminated pixel would have a voltage different from a pixel that has no illumination, and this difference in potential is used to control the pixel reflectivity for electron beam 74.

This latter scheme significantly reduces concerns due to pixel density and associated multilayer wiring. The incident electron beam is now reflected in an n×m pixel array, and the electron beam in each pixel can be turned on and off independently of all other pixel elements. Effectively, the reflected beam now includes n×m independent electron beams, each with a high-contrast on/off ratio.

This programmable electron beam array can be scanned across a wafer to write arbitrary patterns at high resolution and high speed. This method solves the disadvantages of the workfunction-based SUPREMA mask since the programmable mask is stationary. If the mask gets covered by a contaminating carbon film, it may be necessary to adjust the overall potential of the mask by a volt or so, but the contrast between on and off pixels is completely unaffected by this overall voltage shift.

In addition, the mask is universal. That is, printing a new pattern does not require a new mask wafer but only a new pattern generated by the software addressing the mask surface pixels. Of course, the programmable mask is significantly more complex than the workfunction mask, but given the high costs of present high resolution masks, and the escalation of that cost to be expected for membrane and stencil masks, SUPREMA mask costs should not present an unsurmountable barrier, in particular because one mask can serve many different products.

The total electron current in the beam is of the same order as that used in the "Scalpel" and "Prevail" projection methods, resulting in comparable wafer throughput. In fact, the wafer throughput in "Scalpel" is limited by the deleterious effects of space charge in the electron beam crossover just below the objective lens, which carries the full electron beam current. In the inventive scheme presented here, preferably only active pixels carry current, reducing the projected beam current by a factor of two to ten, and mitigating space charge effects. Thus, it is anticipated that the inventive SUPREMA based e-beam writing systems will be capable of wafer throughputs that exceed "Scalpel" throughputs by up to a factor of two.

Having read the above description, one of ordinary skill in the art would readily recognize that software control of any of the various reprogrammable masks is straightforward since it merely includes identifying (and, optionally, retaining in storage on a digital medium) which individual components of an array or matrix are considered "ON" and which are considered "OFF".

Figures 8, 9:
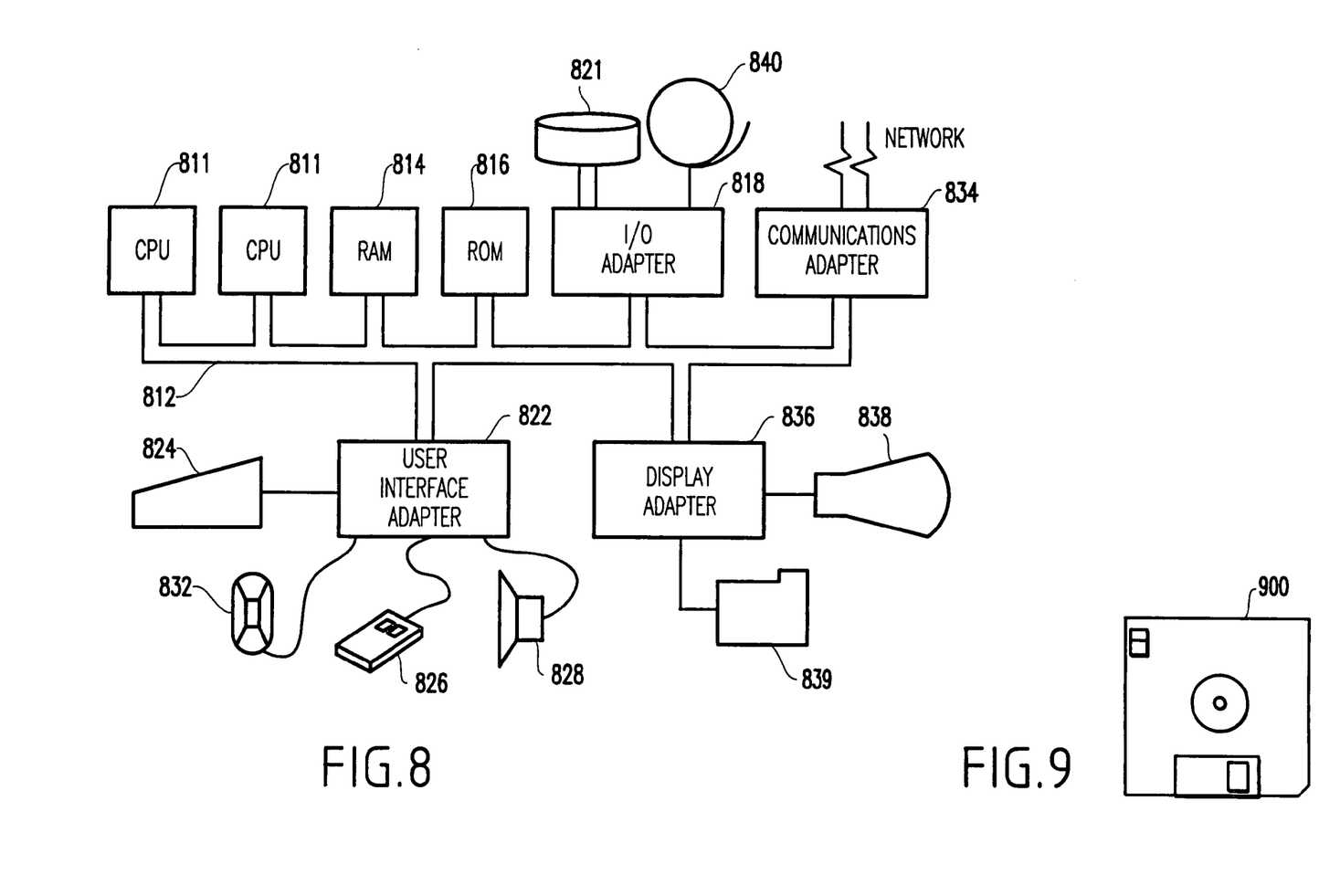
FIG. 8 illustrates an exemplary hardware/information handling system 800 for incorporating the present invention therein.
FIG. 9 illustrates a signal bearing medium 900 (e.g., storage medium) for storing steps of a program of a method according to the present invention to provide a programmable mask as stored in digital format and to provide a digital storage medium for storing the information for individual programmable masks.

FIG. 8 illustrates a typical hardware configuration of an information handling/computer system in accordance with the invention and which preferably has at least one processor or central processing unit (CPU) 811.

The CPUs 811 are interconnected via a system bus 812 to a random access memory (RAM) 814, read-only memory (ROM) 816, input/output (I/O) adapter 818 (for connecting peripheral devices such as disk units 821 and tape drives 840 to the bus 812), user interface adapter 822 (for connecting a keyboard 824, mouse 826, speaker 828, microphone 832, and/or other user interface device to the bus 812), a communication adapter 834 for connecting an information handling system to a data processing network, the Internet, an Intranet, a personal area network (PAN), etc., and a display adapter 836 for connecting the bus 812 to a display device 838 and/or printer 839 (e.g., a digital printer or the like).

In addition to the hardware/software environment described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, comprising signal-bearing media tangibly embodying a program of machine-readable instructions executable by a digital data processor incorporating the CPU 811 and hardware above, to perform the method of the invention.

This signal-bearing media may include, for example, a RAM contained within the CPU 811, as represented by the fast-access storage for example. Alternatively, the instructions may be contained in another signal-bearing media, such as a magnetic data storage diskette 900 (FIG. 9), directly or indirectly accessible by the CPU 811.

Whether contained in the diskette 900, the computer/CPU 811, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g. CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A method of controlling a beam used to generate a pattern on a target surface, comprising:
    generating a beam of charged particles and directing said beam to a mask surface; and
    causing said beam to be one of absorbed by and reflected from said mask surface, thereby either precluding or allowing said beam to strike said target surface based on a reflection characteristic of said mask surface,
    wherein said reflection characteristic is due to a mechanism such that a pattern on said mask surface is changeable without having to re-fabricate said mask,
    wherein said mechanism is due to providing a difference of electrical potential on said mask surface and said difference of electrical potential is changeable without further modifying said mask, thereby providing a programmable mask by selectively controlling an electrical potential on different portions of said mask surface to change a pattern thereon,
    wherein said programmable mask comprises a matrix of programmable portions on said mask surface, and
    wherein said matrix of programmable portions comprises a matrix of photodiodes.

2. The method of claim 1, wherein said charged particles comprise electrons.

3. An apparatus for generating a pattern on a target wafer surface, comprising:
    a beam generator for generating a beam of charged particles in a first path;
    a magnetic deflector for deflecting said beam from said first path onto a mask surface, wherein a characteristic of said mask surface causes charged particles of said deflected beam to be one of absorbed by and reflected from said mask surface; and
    a magnetic deflector to deflect said charged particles that are reflected from said mask surface to strike said target surface,
    wherein said reflection characteristic is due to a difference in potential on said mask surface in a pattern that can be changed without re-fabricating said mask,
    wherein said pattern is due to a difference of electrical potential on different areas of said mask surface and said difference of electrical potential is selectively changeable, thereby providing a programmable mask,
    wherein said programmable mask comprises a matrix of programmable portions on said mask surface,
    wherein said matrix of programmable portions comprises a matrix of photodiodes.

4. The apparatus of claim 3, wherein said deflection is approximately 90° and said first magnetic deflector and said second magnetic deflector are the same.

5. A mask used for controlling a beam for generating a pattern on a target wafer surface, said beam comprising charged particles directed onto a surface of said mask, said mask comprising:
    a substantially planar surface, wherein said surface contains a plurality of areas, each said area having a surface characteristic such that said beam is one of substantially absorbed by said surface and reflected from said surface, and a pattern created by said plurality of areas on said mask surface can be changed without having to re-fabricate said mask,
    wherein said pattern is due to a difference of electrical potential on different areas of said mask surface and said difference of electrical potential is selectively changeable, thereby providing a programmable mask,
    wherein said programmable mask comprises a matrix of programmable portions on said mask surface,
    wherein said matrix of programmable portions comprises a matrix of photodiodes.

6. The method of claim 1, further comprising:
    controlling where a light shines, said light thereby selectively causing ones of said photodiodes of said matrix of photodiodes to generate an electrical potential.

7. The method of claim 6, further comprising:
    retrieving data from a signal-bearing medium tangibly embodying a machine-readable data retrievable and executable by a digital processing apparatus, said data being retrieved for controlling said reflection of said beam particles.

8. A method of controlling a beam used to generate a pattern on a target surface, comprising:
    generating a beam of charged particles and directing said beam to a mask surface; and
    causing said beam to be one of absorbed by and reflected from said mask surface, thereby either precluding or allowing said beam to strike said target surface based on a reflection characteristic of said mask surface,
    wherein said reflection characteristic is due to a mechanism such that a pattern on said mask surface is changeable without having to re-fabricate said mask,
    wherein said mechanism is due to a difference in electrical potential on said mask surface caused by a photovoltage material having a light selectively shining thereon, thereby allowing said pattern to be readily changed.

* * * * *